United States Patent
Kobayashi et al.

(10) Patent No.: US 10,869,419 B2
(45) Date of Patent: *Dec. 15, 2020

(54) COMPONENT SUPPLY MANAGEMENT SYSTEM AND COMPONENT SUPPLY MANAGEMENT METHOD

(71) Applicant: Panasonic Intellectual Property Management Co., Ltd., Osaka (JP)

(72) Inventors: Hiroki Kobayashi, Fukuoka (JP); Daisuke Mizokami, Fukuoka (JP); Ryouji Eguchi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/131,260

(22) Filed: Sep. 14, 2018

(65) Prior Publication Data

US 2019/0098807 A1 Mar. 28, 2019

(30) Foreign Application Priority Data

Sep. 25, 2017 (JP) ................................. 2017-183698

(51) Int. Cl.
*H05K 13/08* (2006.01)
*H05K 13/02* (2006.01)
(Continued)

(52) U.S. Cl.
CPC ......... *H05K 13/0215* (2018.08); *B65H 20/22* (2013.01); *H05K 13/0417* (2013.01); *H05K 13/086* (2018.08)

(58) Field of Classification Search
None
See application file for complete search history.

(56) References Cited

U.S. PATENT DOCUMENTS 6,157,870 A * 12/2000 Gfeller ................. B23P 19/001
700/231
2015/0373885 A1* 12/2015 Matsuoka .......... H05K 13/0882
29/739

(Continued)

FOREIGN PATENT DOCUMENTS

JP 2017-103374 6/2017

*Primary Examiner* — Brent Swarthout
(74) *Attorney, Agent, or Firm* — Pearne & Gordon LLP

(57) ABSTRACT

A component supply management system includes a threshold setting portion, a remaining-amount detection portion, a determination portion, and a notification portion. The threshold setting portion sets a threshold with respect to a remaining amount capable of being supplied by the carrier tape, for each of the tape feeders, depending on types of the tape feeders. The remaining-amount detection portion detects a remaining amount of components capable of being supplied by the carrier tape, for each of the tape feeders. The determination portion determines whether the remaining amount detected by the remaining-amount detection portion is lower than the threshold set in the threshold setting portion, for each of the tape feeders. The notification portion issues a warning for recommending replenishment of a carrier tape for the tape feeder in which the determination portion determines that the remaining amount is lower than the threshold.

12 Claims, 5 Drawing Sheets

(51) Int. Cl.
*B65H 20/22* (2006.01)
*H05K 13/04* (2006.01)

(56) References Cited

U.S. PATENT DOCUMENTS

| | | | |
|---|---|---|---|
| 2016/0205820 A1* | 7/2016 | Ohashi | H05K 13/021 29/739 |
| 2017/0164530 A1* | 6/2017 | Yasuhira | H05K 13/021 |
| 2017/0308963 A1* | 10/2017 | Takehara | G06Q 10/06311 |
| 2019/0254203 A1* | 8/2019 | Ikeyama | H05K 13/0419 |

* cited by examiner

COMPONENT SUPPLY MANAGEMENT SYSTEM AND COMPONENT SUPPLY MANAGEMENT METHOD

BACKGROUND

1. Technical Field

The present disclosure relates to a component supply management system and a component supply management method for managing a component supply state of a tape feeder that allows a carrier tape to travel so as to supply a component to a component supply position.

2. Description of the Related Art

In a component mounting device for mounting a component on a substrate, a tape feeder is widely used as a component supply device for supplying a component. The tape feeder has a configuration of pitch-feeding a carrier tape inserted from a tape insertion port by a rotation operation with a sprocket, thereby supplying a component held in the carrier tape to a predetermined component supply position. In a conventional tape feeder, in order to allow a following carrier tape (following tape) to travel continuously to a preceding carrier tape (preceding tape), it has been necessary to connect (splice) the following tape to the preceding tape before an end portion of the preceding tape passes through the tape insertion port of the tape feeder and is drawn into the inside of the tape feeder to cause component depletion.

In recent years, in order to reduce the burden of replenishment work of a carrier tape by an operator, an automatic loading-type tape feeder which automatically loads and pitch-feeds the carrier tape has been developed. In the automatic loading-type tape feeder, when a following tape is disposed on the tape insertion port in a state in which a preceding tape is pitch-fed, the following tape is pitch-fed so as to follow an end portion of the preceding tape. Accordingly, conventional splicing is not necessary (see, for example, PTL 1). Such an automatic loading-type tape feeder is also called a non-splicing feeder.

A component mounting device issues a warning for recommending an operator to replenish a following tape before component supply by a preceding tape is completed. However, a timing at which this warning is issued is largely different between a conventional splicing-type tape feeder (a splicing feeder) and the above-mentioned non-splicing feeder. In the splicing feeder, because splicing of the following tape must be carried out at a predetermined time at which an end portion of the preceding tape approaches the tape insertion port, a time zone in which the following tape can be replenished is extremely limited. On the contrary, in the non-splicing feeder, the following tape can be replenished in relatively free time zone.

CITATION LIST

Patent Literature

PTL 1: Japanese Patent Application Unexamined Publication No. 2017-103374

SUMMARY

A component supply management system of the present disclosure is a system for managing a component supply state of a tape feeder that allows a carrier tape inserted from a tape insertion port to travel so as to supply a component held in the carrier tape to a component supply position.

The component supply management system includes a threshold setting portion, a remaining-amount detection portion, a determination portion, and a notification portion.

The threshold setting portion sets a threshold with respect to a remaining amount capable of being supplied by the carrier tape, for each of the tape feeders, depending on types of the tape feeders.

The remaining-amount detection portion detects a remaining amount of components capable of being supplied by the carrier tape, for each of the tape feeders.

The determination portion determines whether the remaining amount of components capable of being supplied, which is detected by the remaining-amount detection portion, is lower than the threshold set in the threshold setting portion, for each of the tape feeders.

The notification portion issues a warning for recommending replenishment of the carrier tape for the tape feeder in which the determination portion determines that the remaining amount of components capable of being supplied is lower than the threshold.

A component supply management method of the present disclosure is a method for managing a component supply state of a tape feeder that allows a carrier tape inserted from a tape insertion port to travel so as to supply a component held in the carrier tape to a component supply position.

The component supply management method includes a threshold setting step, a remaining amount detection step, a determination step, and a tape replenishment notification step.

The threshold setting step sets a threshold with respect to a remaining amount capable of being supplied by the carrier tape, for each of the tape feeders, depending on types of the tape feeders.

The remaining amount detection step detects a remaining amount of components capable of being supplied by the carrier tape, for each of the tape feeders.

The determination step determines whether the remaining amount of components capable of being supplied, which is detected in the remaining amount detection step, is lower than the threshold set in the threshold setting step, for each of the tape feeders.

The tape replenishment notification step issues a warning for recommending replenishment of the carrier tape for the tape feeder in which it is determined that, in the determination step, the remaining amount of components capable of being supplied is lower than the threshold.

DETAILED DESCRIPTION

A component mounting device may include a splicing feeder and a non-splicing feeder. In this case, when a warning for recommending replenishment of a following tape is matched to one tape feeder, replenishing of a following tape may be late or, on the contrary, too early, with respect to the other tape feeder, thus lowering the working efficiency.

Figure 1:
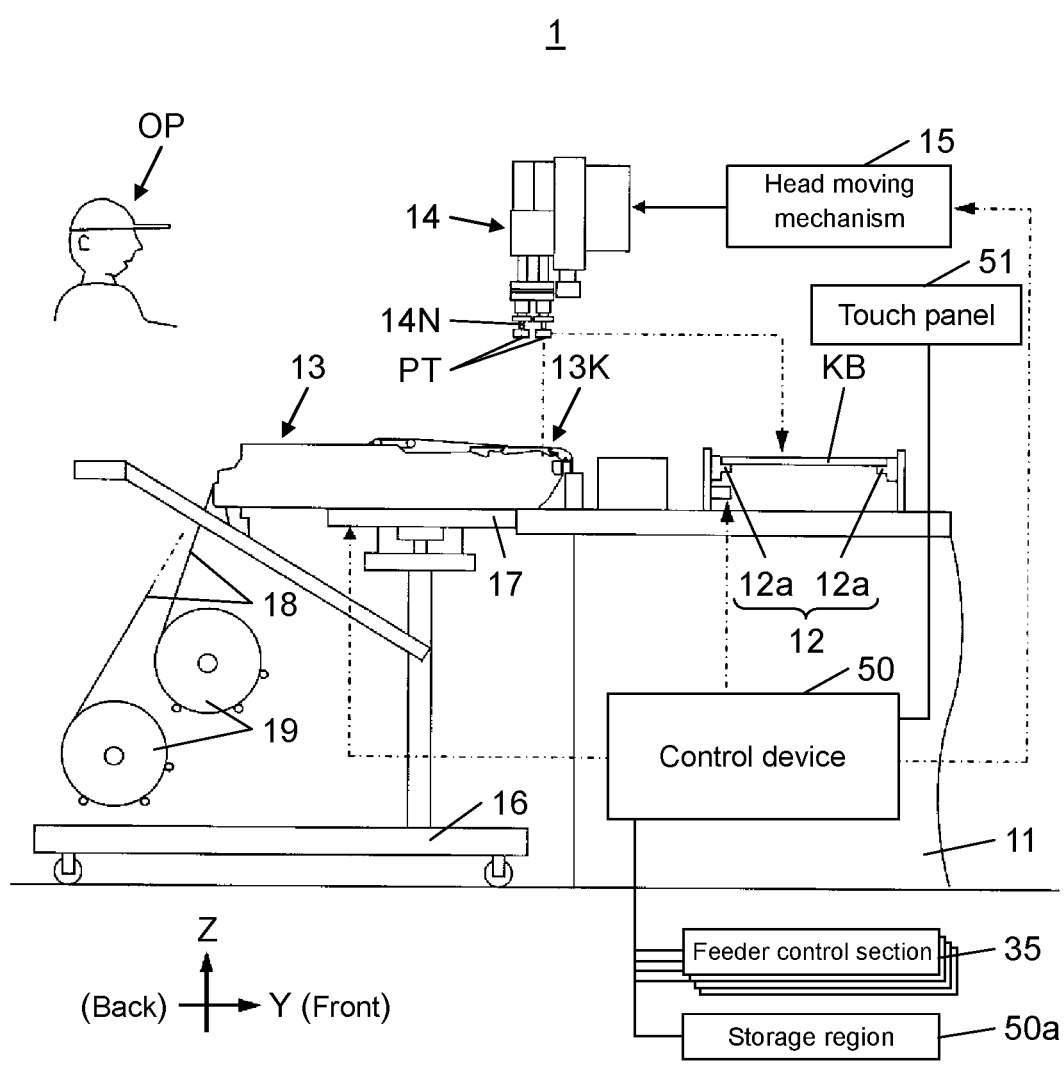
FIG. 1 is a schematic configuration view of a component mounting device as a component supply management system in accordance with an exemplary embodiment.

Hereinafter, with reference to drawings, this exemplary embodiment is described. FIG. 1 shows component mounting device 1 as a component management system in accordance with this exemplary embodiment. Component mounting device 1 operates to mount a component PT on a substrate KB that is carried in from the upstream side and to carry out the component PT to the downstream side. In this exemplary embodiment, the left-and-right direction seen from an operator OP (direction perpendicular to a sheet of FIG. 1, and a direction of transporting the substrate KB) is defined as an X axial direction, and the forward-and-backward direction seen from the operator OP (left-and-right direction of the sheet of FIG. 1) is defined as a Y axial direction. Furthermore, the vertical direction (the vertical direction of the sheet of FIG. 1) is defined as a Z axial direction.

In FIG. 1, component mounting device 1 includes base table 11, substrate transport portion 12, a plurality of tape feeders 13, mounting head 14, and head moving mechanism 15. Substrate transport portion 12 includes a pair of conveyor mechanisms 12a, and transports the substrate KB in the X axial direction such that the substrate KB is positioned in a predetermined work position. The plurality of tape feeders 13 is arranged in the X axial direction and attached to feeder base 17 that is a part of cart 16 linked to base table 11. Cart 16 keeps reel 19 on which carrier tape 18 holding the component PT is wound. Tape feeders 13 pitch-feed carrier tape 18 drawn from reel 19 and allow carrier tape 18 to travel, thereby supplying the component PT to component supply port 13K as a component supply position.

In FIG. 1, mounting head 14 has a plurality of nozzles 14N extending downward. Nozzles 14N can move up and down and rotate around the Z-axis. Furthermore, nozzles 14N can generate a vacuum suction force for adsorbing the components PT at the lower end thereof. Head moving mechanism 15 move mounting head 14 between tape feeders 13 and substrate KB. Mounting head 14 adsorbs the components PT supplied by tape feeders 13 by nozzles 14N, and mounts the components PT onto the substrate KB.

Figure 2:
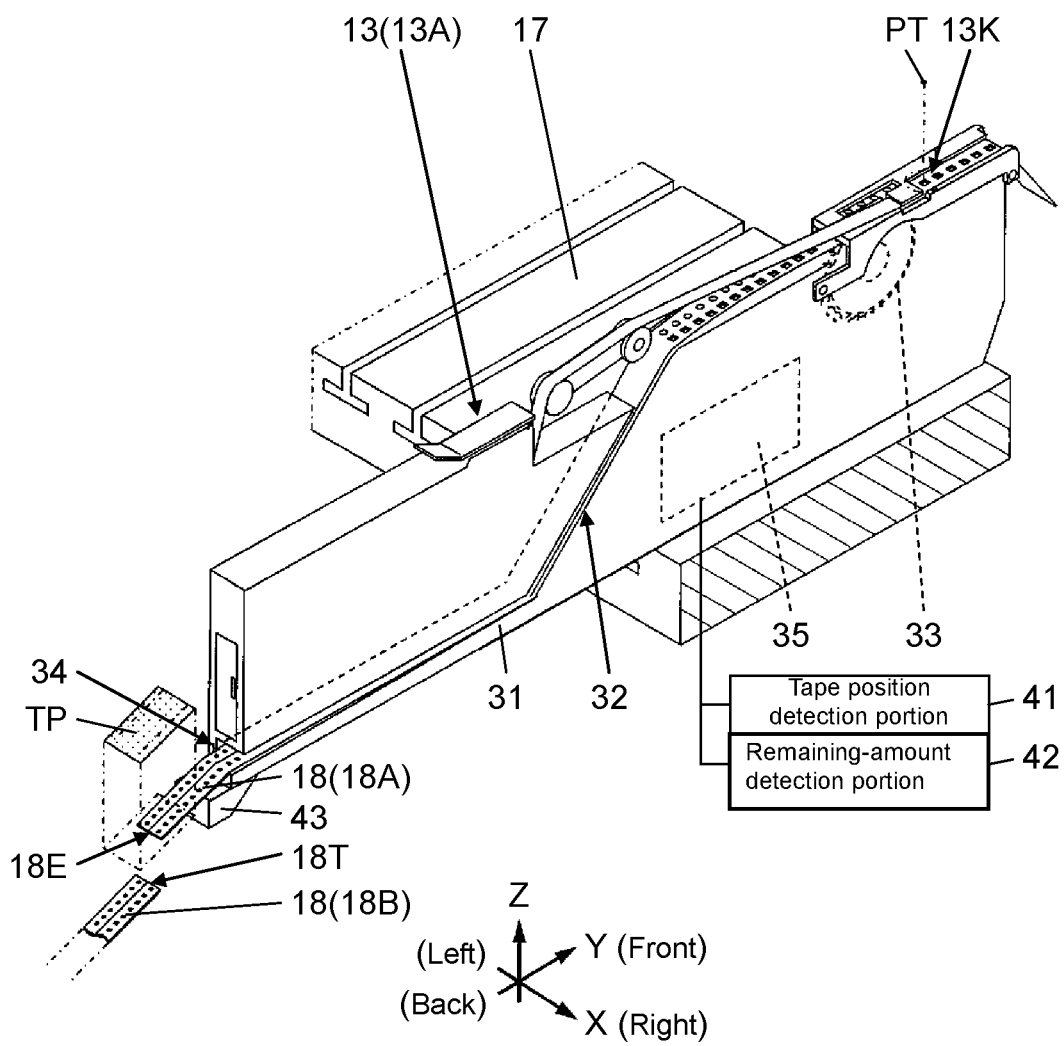
FIG. 2 is a perspective view of a splicing tape that is one type of a tape feeder provided in the component mounting device in accordance with the exemplary embodiment.
Figure 3:
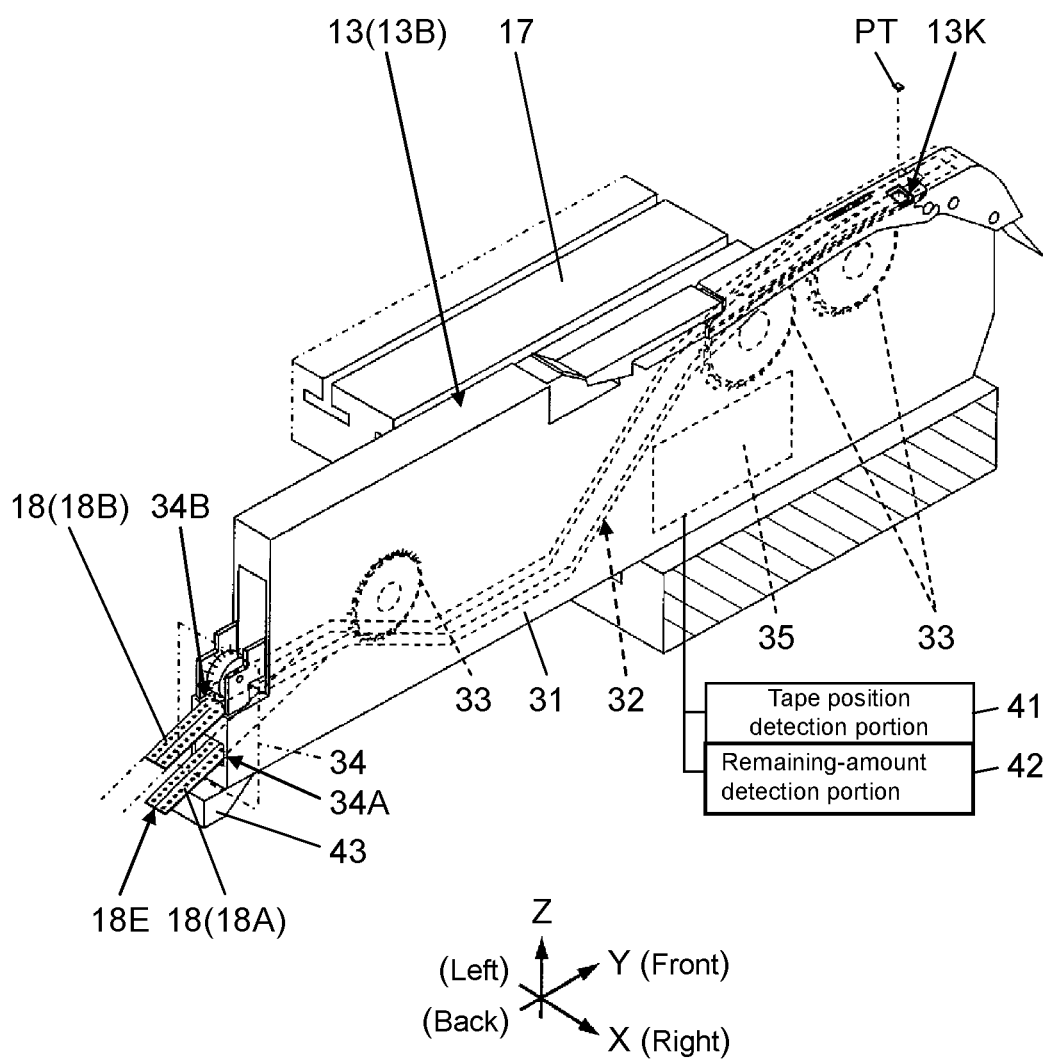
FIG. 3 is a perspective view of a non-splicing tape that is one type of a tape feeder provided in the component mounting device in accordance with the exemplary embodiment.

A plurality of tape feeders 13 used in component mounting device 1 of this exemplary embodiment includes splicing feeder 13A shown in FIG. 2 and non-splicing feeder 13B shown in FIG. 3. Splicing feeder 13A is a tape feeder that requires connecting (splicing) tip portion 18T of following tape 18B into end portion 18E of preceding tape 18A using a tape member TP when following carrier tape 18 (hereinafter, referred to as "following tape 18B") is allowed to travel continuously to preceding carrier tape 18 (hereinafter, referred to as "preceding tape 18A"). On the other hand, non-splicing feeder 13B is a tape feeder that does not need the above-mentioned splicing when following tape 18B is allowed to travel continuously to preceding tape 18A.

In FIG. 2 and FIG. 3, regardless of whether tape feeder 13 is splicing feeder 13A or non-splicing feeder 13B, tape feeder 13 includes tape path 32 that is a path of carrier tape 18, and sprocket 33 for allowing carrier tape 18 to travel in tape path 32 inside main body 31 attached to feeder base 17 capable of being attached and detached. Tape path 32 extends from the back side to the front side of main body 31, and an opening at the back end side of main body 31 serves as tape insertion port 34 to be used in inserting carrier tape 18 into tape path 32.

In FIG. 2 and FIG. 3, one or a plurality of sprockets 33 is each provided in a position facing tape path 32 inside main body 31 (one sprocket 33 is provided in splicing feeder 13A and a plurality of sprockets 33 is provided in non-splicing feeder 13B). Rotation of each of these one or a plurality of sprockets 33 is controlled by feeder control portion 35 provided in main body 31. Sprocket 33 is rotated in a state in which carrier tape 18 inserted from tape insertion port 34 is engaged in sprocket 33, carrier tape 18 travels forward inside tape path 32, and supplies a component PT to component supply port 13K.

In splicing feeder 13A, first carrier tape 18 is manually engaged with sprocket 33. Then, following tape 18B that follows first carrier tape 18 is connected by a tape member TP before end portion 18E of carrier tape 18, which travels ahead inside tape path 32, reaches tape insertion port 34 (FIG. 2).

On the other hand, in non-splicing feeder 13B, since carrier tape 18 inserted from tape insertion port 34 is automatically loaded, an operator OP is not required to connect following tape 18B to end portion 18E of preceding tape 18A. In non-splicing feeder 13B, tape insertion port 34 includes two insertion ports arranged in the vertical direction (lower insertion port 34A and upper insertion port 34B) (FIG. 3). When preceding tape 18A is inserted into non-splicing feeder 13B, following tape 18B is inserted into upper insertion port 34B. After end portion 18E of preceding tape 18A is drawn into main body 31, when following tape 18B is started to be sent, following tape 18B is drawn downward to the lower part and moved to lower insertion port 34A by the operator OP. Note here that when carrier tape 18 is not inserted into non-splicing feeder 13B, carrier tape 18 may be inserted into lower insertion port 34A.

In this way, in this exemplary embodiment, tape feeder 13 allows carrier tape 18 inserted from tape insertion port 34 to travel so as to supply a component PT held in carrier tape 18 to component supply port 13K as a component supply position.

In FIG. 2 and FIG. 3, a plurality of sensors (not shown) and tape position detection portion 41 are provided in main body 31 of tape feeder 13. The plurality of sensors detect a passage of tip portion 18T and end portion 18E of carrier tape 18 that travels in tape path 32. Information on the passage of carrier tape 18, which is detected by the plurality of sensors, is transmitted to feeder control portion 35. Then, tape position detection portion 41 detects presence or absence (position) of carrier tape 18 from the transmitted information on the passage.

In FIG. 2 and FIG. 3, remaining-amount detection portion 42 is provided in main body 31 of tape feeder 13. Remaining-amount detection portion 42 detects a remaining amount of components PT capable of being supplied (hereinafter, referred to as a "remaining amount of components capable of being supplied" or "remaining amount of components") by carrier tape 18 (hereinafter, referred to as a "component supply tape," which corresponds to preceding tape 18A in relation to the following tape 18B) that travels inside tape path 32 and supplies components PT. The information detected by remaining-amount detection portion 42 of tape feeder 13 is transmitted to feeder control portion 35.

The above-mentioned "remaining amount of components" is a parameter indicating how much more component PT can be supplied by the component supply tape. The "remaining amount of components" can be defined by a remaining number of components PT of the component supply tape (number of remaining components), or a remaining length of the component supply tape (tape remaining length)." Therefore, when the remaining amount of components is defined by the number of remaining components, remaining-amount detection portion 42 is a type that detects the remaining number of components PT of the component supply tape. Meanwhile, when the remaining amount of components is defined by the remaining length of a tape, remaining-amount detection portion 42 is a type that detects the remaining length of the component supply tape. Note here that remaining-amount detection portion 42 may detect the remaining amount of components using the plurality of sensors mentioned above, or detected by software from the number of components PT supplied from tape feeder 13, or may be detected by a conventionally used detector.

When remaining-amount detection portion 42 is a type that detects the remaining number of components, remaining-amount detection portion 42 calculates the remaining number of components PT of the component supply tape based on the number of components read at the time when component PT at the leading position of the component supply tape reaches component supply port 13K, and the pitch feeding times after the component PT of the leading position of the component supply tape reaches component supply port 13K. Then, remaining-amount detection portion 42 obtains the remaining amount of components PT capable of being supplied by the component supply tape based on the calculated remaining number of the components PT. On the other hand, when remaining-amount detection portion 42 is a type that detects the remaining length of the tape, remaining-amount detection portion 42 calculates the remaining amount of components PT capable of being supplied by the component supply tape based on the position of carrier tape 18 (that is, the component supply tape) inside tape path 32, detected by tape position detection portion 41, and the length of carrier tape 18, which is stored in advance.

The remaining amount of components PT capable of being supplied by the component supply tape may be defined by any one of the remaining number of components and the remaining length of the tape. In this exemplary embodiment, any of the remaining number of components and the remaining length of the tape can be optionally selected depending on situations. Therefore, in this exemplary embodiment, as remaining-amount detection portion 42, both the type that detects the remaining number of components and the type that detects the remaining length of the tape are provided.

In FIG. 2 and FIG. 3, tape presence detector 43 is provided in a vicinity of tape insertion port 34 in the back end portion of main body 31 of tape feeder 13. Tape presence detector 43 detects presence or absence of carrier tape 18 at a position of tape insertion port 34. When tape presence detector 43 detects that carrier tape 18 is present at tape insertion port 34, it is shown that the component supply tape is not still in a state of component depletion. On the other hand, when tape presence detector 43 detects that carrier tape 18 is not present at tape insertion port 34, it is shown that the component supply tape is depleted. Information detected by tape presence detector 43 is transmitted to feeder control portion 35 (FIGS. 2 and 3).

In FIG. 1, control device 50 of component mounting device 1 controls the transport of the substrate KB by substrate transport portion 12. Furthermore, control device 50 controls the movement of mounting head 14 by head moving mechanism 15. Furthermore, control device 50 controls actuation of nozzles 14N by mounting head 14 and adsorption by nozzles 14N. Feeder control portion 35 of tape feeder 13 attached to feeder base 17 is connected to control device 50. Information obtained by feeder control portion 35 of tape feeder 13 is transferred to control device 50. Herein, the information obtained by feeder control portion 35 includes is information of position of the component supply tape detected by tape position detection portion 41 of tape feeder 13, information on the remaining number of components capable of being supplied by carrier tape 18, which is detected by remaining-amount detection portion 42, and information on presence or absence of carrier tape 18 in tape insertion port 34, which is detected by tape presence detector 43, and the like.

Touch panel 51 is connected to control device 50, and an operator OP can carry out a necessary input into control device 50 through touch panel 51. Furthermore, control device 50 gives various instructions to the operator OP through touch panel 51, and notifies the operator OP of information. Note here that touch panel 51 may not be provided to component mounting device 1, and may be, for example, a portable terminal possessed by an operator OP. Alternatively, touch panel 51 may be an input/output screen (not shown) provided to tape feeder 13. In a case of the input/output screen of tape feeder 13, notification may be carried out by a light-emitting portion that changes a light-emitting color or a light-emitting pattern depending on the content of the instruction or information.

Figure 4:
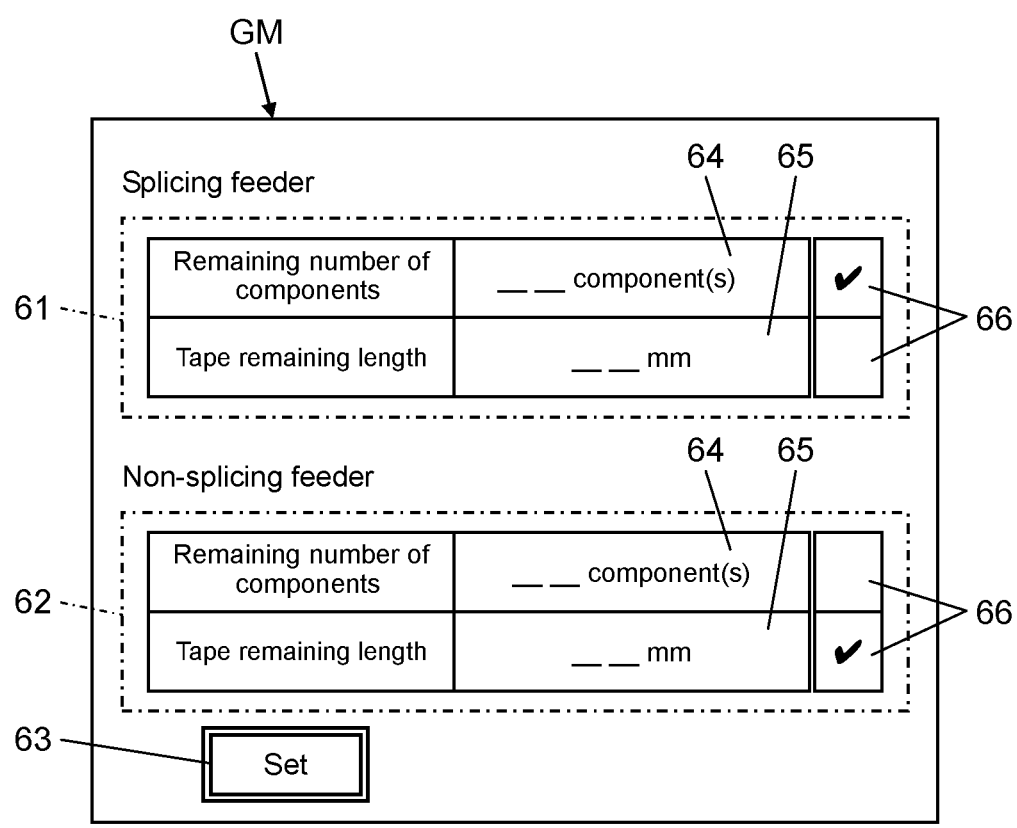
FIG. 4 is a view showing one example of a screen of a touch panel for setting a threshold, which is provided in the component mounting device in accordance with the exemplary embodiment.

When an operator OP carries out a predetermined operation, touch panel 51 displays a threshold input screen GM shown in FIG. 4. The operator OP can input a threshold with respect to the remaining amount capable of being supplied by carrier tape 18 (component supply tape) from the threshold input screen GM of touch panel 51 for each tape feeder 13, depending on the types of tape feeders 13.

Herein, the above-mentioned threshold is defined based on the minimum remaining amount of components capable of being supplied, which can secure necessary time for an operator OP to carry out a replenishment working of following tape 18B. The replenish working means working for connecting following tape 18B to preceding tape 18A in splicing feeder 13A, and working for inserting following tape 18B into tape insertion port 34 in non-splicing feeder 13B. The "minimum remaining amount of components capable of being supplied" can be obtained from the time necessary to working mentioned above, and the speed of supplying of component PT by tape feeder 13 (herein, a speed of pitch-feeding of carrier tape 18).

Touch panel 51 sets a threshold input by the operator OP from threshold input screen GM shown in FIG. 4. Specifically, touch panel 51 stores the input threshold in storage region 50a of control device 50 (FIG. 1). In this way, in this exemplary embodiment, touch panel 51 is a threshold setting portion for setting a threshold with respect to the remaining amount capable of being supplied by carrier tape 18 set for each tape feeder 13 depending on the types of tape feeder 13.

The threshold input screen GM displayed on touch panel 51 shown in FIG. 4 includes upper-stage input space 61 of splicing feeder 13A, lower-stage input space 62 of non-splicing feeder 13B, and setting button 63. Each of upper-stage input space 61 and lower-stage input space 62 is provided with component remaining number input space 64 and tape remaining length input space 65, and selecting space 66.

In FIG. 4, component remaining number input space 64 is an input space for inputting a remaining number of components as a remaining amount of components capable of being supplied to be set in splicing feeder 13A. Furthermore, tape remaining length input space 65 is an input space for inputting the remaining length of the tape as a remaining amount of components capable of being supplied to be set in splicing feeder 13A. Selecting space 66 is an input space for designating which of the remaining number of components or the remaining length of the tape is selected as the remaining amount of components capable of being supplied to be set to splicing feeder 13A. Conditions (states) designated in selecting space 66 (for example, as shown in FIG. 4, designated by putting a checked mark) is designated as the remaining amount of components capable of being supplied.

An operator OP inputs a value of a remaining amount of components capable of being supplied, which is intended to be set by the operator OP, into component remaining number input space 64 and tape remaining length input space 65 of upper stage input space 61 and lower stage input space 62, respectively. That is to say, the operator OP inputs the number of components PT into component remaining number input space 64, and inputs the remaining length of carrier tape 18 into tape remaining length input space 65. Then, when the operator OP operates setting button 63 in the threshold input screen GM, a threshold input in the threshold input screen GM of touch panel 51 is set in control device 50 (stored in storage region 50a).

Control device 50 determines whether the remaining amount of components capable of being supplied, which is detected by remaining-amount detection portion 42, is lower than the threshold set in the above-mentioned threshold setting portion for each tape feeder 13. Touch panel 51 is controlled by control device 50, and issues a warning for recommending replenishment of carrier tape 18 for tape feeder 13 in which it is determined that the remaining amount of components capable of being supplied is lower than the threshold, through the screen of touch panel 51. Thus, the operator OP can understand which tape feeder 13 requires replenishment of carrier tape 18 based on the warning displayed on touch panel 51.

In this way, in this exemplary embodiment, touch panel 51 is a notification portion that issues a warning a warning for recommending replenishment of carrier tape 18 for tape feeder 13 in which control device 50 as a determination portion determines that a remaining amount of components capable of being supplied is lower than the threshold.

Figure 5:
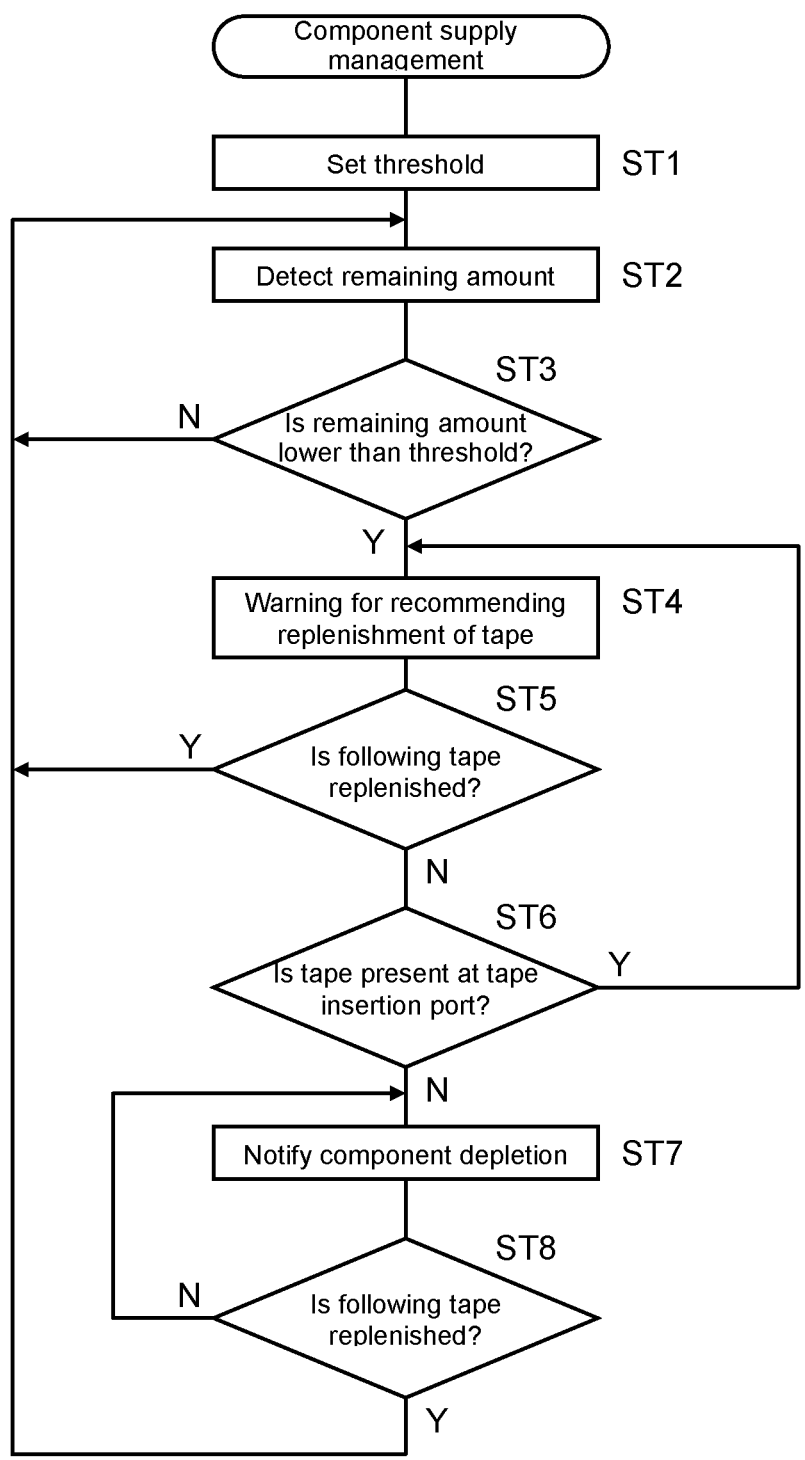
FIG. 5 is a flowchart showing a flow of component supply management control executed by the component mounting device in accordance with the exemplary embodiment.

Next, with reference to a flowchart shown in FIG. 5, a flow of execution procedure (a component supply management method) of a component supply management control executed by component mounting device 1 as a component supply management system in this exemplary embodiment is described. In the component supply management control, firstly, the operator OP carries out an input operation from touch panel 51 in the above-mentioned manner, sets a threshold with respect to the remaining amount capable of being supplied by carrier tape 18 for each tape feeders 13 depending on the types of tape feeders 13 (a threshold setting step of step ST1 shown in FIG. 5).

When the threshold is set, control device 50 allows component mounting device 1 to execute component mounting work. Control device 50 carries out tape replenishment assist control of the following steps ST2 to ST8 for tape feeder 13 while control device 50 allows component mounting device 1 to execute the component mounting work.

In the tape replenishment assist control, firstly, remaining-amount detection portion 42 detects the remaining amount of components capable of being supplied by the component supply tape (carrier tape 18 that actually carries out supply of component PT) in tape feeder 13 (remaining amount detection step of step ST2). Then, the detected amount of the remaining components capable of being supplied is compared with the threshold set in step ST1 (a threshold set for tape feeder 13). Then, it is determined whether the remaining amount of components is lower than the threshold (a determination step of step ST3).

Herein, the remaining amount of components detected by remaining-amount detection portion 42 is a value that is reduced every time when the component supply tape is pitch-fed and component PT is supplied to component supply port 13K, while the set threshold is a fixed value. Therefore, with the progress of supply of supply of the component PT (the passage of time), the remaining amount of components approaches the threshold. Note here that both of the remaining amount of components detected in step ST2 and the threshold of step ST3 are values selected in selecting space 66 of threshold input screen GM among the remaining number of components and the remaining length of the tape set in the threshold setting step.

When the remaining amount of components is not lower than the threshold in the determination of step ST3, control device 50 determines that replenishment of following tape 18B is not still needed (not necessarily need), and the process returns step ST2. Meanwhile, when the remaining amount of components is lower than the threshold in the determination of step ST3, control device 50 determines that replenishment of following tape 18B is needed, and issues a warning to recommend an operator OP to replenish carrier tape 18 through touch panel 51 (a tape replenishment notification step of step ST4).

When replenishment of carrier tape 18 is recommended through touch panel 51, the operator OP carries out replenishment of carrier tape 18 for tape feeder 13 that is an object of warning. Specifically, as mentioned above, for splicing feeder 13A, tip portion 18T of following tape 18B is connected to end portion 18E of preceding tape 18A by a tape member TP. For non-splicing feeder 13B, following tape 18B is inserted into upper insertion port 34B of tape insertion port 34. After replenishment of carrier tape 18 is finished, the operator OP carries out a predetermined replenishment completion operation from the input/output screen provided to touch panel 51 or tape feeder 13.

After control device 50 issues a warning for recommending replenishment of carrier tape 18 through touch panel 51, control device 50 enters into a state of monitoring whether an operator OP carries out a replenishment completion operation (a replenishment completion monitoring step of step ST5). Then, when control device 50 senses that the operator OP carries out the replenishment completion operation, control device 50 determines that replenishment of carrier tape 18 is carried out for tape feeder 13 in which replenish is recommend, and the process returns step ST2. On the other hand, when it is not sensed that the operator OP carries out a replenishment completion operation, control device 50 determines that replenishment of carrier tape 18 is not still carried out in step ST5, and determines whether component depletion occurs in carrier tape 18. This determination is carried out by determining whether tape presence detector 43 detects that carrier tape 18 is present at a position of tape insertion port (a tape presence determination step of step ST6).

When control device 50 determines that tape presence detector 43 detects a state in which carrier tape 18 is present at a position of tape insertion port 34 in step ST6, control device 50 determines that the component supply tape is not in a state of component depletion, returns the process to step ST4, and continues to recommend replenishment of carrier tape 18. On the contrary, when control device 50 determines that tape presence detector 43 detects a state in which carrier tape 18 is not present at a position of tape insertion port 34 in step ST6, control device 50 determines that the component supply tape is in a state of component depletion, and notifies the operator OP of component depletion through the screen of touch panel 51 (a component depletion notification step of step ST7). Thus, in this exemplary embodiment, touch panel 51 as a notification portion notifies the component depletion when tape presence detector 43 detects that carrier tape 18 is not present at a position of tape insertion port 34.

The warning of component depletion includes the meaning of recommendation of replenishment of carrier tape 18, and also notifies more important situation than the recommendation of replenishment. Therefore, an operator OP needs to urgently replenish following tape 18B. In a state of component depletion, since end portion 18E of carrier tape 18 is already drawn into main body 31, when tape feeder 13 is splicing feeder 13A, after the components PT of preceding tape 18A are all consumed, the operator OP removes splicing feeder 13A from component mounting device 1. Furthermore, the operator OP manually sends following tape 18B, and attaches it to sprocket 33. Then, the operator OP attaches splicing feeder 13A to component mounting device 1 again. Thus, these operations may be more troublesome than those at the time of warning in step ST4. Therefore, for splicing feeder 13A, the operator OP is expected to replenish following tape 18B before component is depleted, if possible. The operator OP receives the warning of the component depletion, and replenishes following tape 18B. These operations are completed, the operator OP carries out a predetermined replenishment completion operation through touch panel 51.

After control device 50 issues a warning of the above-mentioned component depletion through panel 51, control device 50 enters into a monitoring state and monitors whether the operator OP carries out a replenishment completion operation (a replenishment completion monitoring step in step ST8). When control device 50 does not senses that the replenishment completion operation is not carried out by the operator OP, it continues to issue a warning of component depletion. When control device 50 senses that the replenishment completion operation is carried out by the operator OP, it determines that the component depletion is dissolved and returns the process to the step ST2.

As described above, in the component mounting device 1 (component supply management system) and the component supply management method in this exemplary embodiment, a threshold with respect to the remaining amount capable of being supplied by carrier tape 18 can be set for each tape feeders 13 depending on the types of tape feeders 13. Then, for tape feeder 13 in which the remaining amount of components is lower than the threshold because of traveling of carrier tape 18, a warning for recommending replenishment of following tape 18B is issued. Therefore, even when splicing feeders 13A and non-splicing feeders 13B of different types are present as tape feeder 13, replenishment of following carrier tape 18 can be carried out at an appropriate time depending on the types of tape feeders 13. As a result, the working efficiency can be improved.

Although this exemplary embodiment has been described so far, the present invention is not limited to the foregoing. For example, in the above-mentioned exemplary embodiment, only component mounting device 1 constitutes a component supply management system. However, component mounting device 1 may constitute, for example, a component mounting line together with the other component mounting devices, and the component mounting devices constituting a component mounting line may exchange information with each other between them via host computer and the like. In such a case, a control device of the host computer may be provided with functions of a threshold setting portion, a determination portion, or the like, in the above-mentioned exemplary embodiment. In such a case, the component supply system is an entire component mounting line including component mounting device 1.

Furthermore, in the above-mentioned exemplary embodiment, when step ST6 determines that tape presence detector 43 detects a state in which carrier tape 18 is not present at a position of tape insertion port 34, step ST7 notifies component depletion. However, determination of presence or absence of carrier tape 18 is not necessarily limited to this. For example, a second threshold, which is smaller than the threshold with respect to the remaining amount of components capable of supplied, is further provided, and the component depletion may be notified when the remaining number of components or the remaining length of the tape is lower than the second threshold.

Furthermore, since a method for supplying following tape 18B in non-splicing feeder 13B is only required to insert following tape 18B into upper insertion port 34B of tape insertion port 34, preceding tape 18A is not required to be left in tape insertion port 34. Therefore, when the remaining number of components or the remaining length of the tape of carrier tape 18 whose total length falls in tape path 32 is set as a threshold, a warning for recommending replenishment of a tape can be used as a warning of component depletion. In that case, in tape replenishment assist control, step ST6 can be omitted.

Furthermore, in the above-mentioned exemplary embodiment, one of the remaining number of components and the remaining length of the tape is input as a numerical value as a threshold with respect to the remaining amount of components capable of supplied by carrier tape 18. However, a mode set in a predetermined numerical value may be selected. Herein, in non-splicing feeder 13B, preceding tape 18A and following tape 18B are inserted into lower insertion port 34A and upper insertion port 34B, respectively. In this state, since a plurality of reels 19 is attached to one non-splicing feeder 13B, there is some time until the subsequent replenishment of a tape. However, depending on the degree of sagging of carrier tape 18 from reel 19 to tape insertion port 34 of non-splicing feeder 13B, neighboring carrier tapes 18 may be entangled with each other. In order to suppress such possibility, a warning for recommending replenishment of a tape may be set as a tape entanglement suppressing mode. In the warning, the remaining number of components or the remaining length of the tape of carrier tape 18 whose entire length falls in tape path 32 is defined as a threshold.

According to the present disclosure, a following carrier tape can be replenished at appropriate times corresponding to the types of the tape feeder.

The present disclosure can provide a component supply management system and a component supply management method that can replenish a following carrier tape at an appropriate timing depending on the type of the tape feeder.

What is claimed is:

1. A component supply management system managing a component supply state of a tape feeder that allows a carrier tape inserted from a tape insertion port to travel so as to supply a component held in the carrier tape to a component supply position, the system comprising:
   a threshold input screen that sets a respective threshold with respect to a remaining amount of components capable of being supplied by the carrier tape, for each of the tape feeders, depending on types of the tape feeders, each different type of the tape feeders having different respective thresholds;
   a remaining-amount detection portion that detects a remaining amount of components capable of being supplied by the carrier tape, based on a remaining length of the tape, for each of the tape feeders;
   a control device that determines whether the remaining amount of components capable of being supplied, based on the detection of the remaining-amount detection portion, is lower than the respective threshold set in the threshold input screen, for each of the tape feeders, depending on types of the tape feeders; and
   a notification portion that issues a warning for recommending replenishment of the carrier tape for the tape feeder in which the control device determines that the remaining amount of components capable of being supplied is lower than the threshold.

2. The component supply management system of claim 1, wherein the types of the tape feeders include:
   a splicing feeder that requires splicing of a following carrier tape among the carrier tapes, which follows into a preceding carrier tape among the carrier tapes, when the following carrier tape is allowed to travel continuously to the preceding carrier tape; and
   a non-splicing feeder that does not require splicing of a following carrier tape among the carrier tapes, which follows into a preceding carrier tape among the carrier tapes, when the following carrier tape is allowed to travel continuously to the preceding carrier tape.

3. The component supply management system of claim 2, wherein the threshold input screen sets both a threshold of the splicing feeder and a threshold of the non-splicing feeder.

4. The component supply management system of claim 1, wherein the remaining amount of components capable of being supplied by the carrier tape and the threshold are defined by a remaining number of the components held in the carrier tape or a remaining length of the carrier tape.

5. The component supply management system of claim 1, further comprising a tape presence detector that detects whether the carrier tape is present at a position of the tape insertion port,
   wherein the notification portion notifies a warning for recommending replenishment of the carrier tape when the tape presence detector detects that the carrier tape is not present at the position of the tape insertion port.

6. A component supply management method for managing a component supply state of a tape feeder that allows a carrier tape inserted from a tape insertion port to travel so as to supply a component held in the carrier tape to a component supply position, the method comprising:
   a threshold setting step of setting a respective threshold with respect to a remaining amount of components capable of being supplied by the carrier tape, for each of the tape feeders, depending on types of the tape feeders on a threshold input screen, each different type of the tape feeders having different respective thresholds;
   a remaining amount detection step of detecting a remaining amount of components capable of being supplied by the carrier tape, based on a remaining length of the tape, for each of the tape feeders by a remaining-amount detection portion;
   a determination step of determining whether the remaining amount of components capable of being supplied by a control device, based on the detection of the remaining-amount detection step, is lower than the threshold set in the threshold setting step, for each of the tape feeders, depending on types of the tape feeders; and
   a tape replenishment notification step of issuing a warning for recommending replenishment of the carrier tape with respect to the tape feeder by a notification portion in which it is determined in the determination step that the remaining amount of components capable of being supplied is lower than the threshold.

7. The component supply management method of claim 6, wherein the types of the tape feeders include:
   a splicing feeder that requires splicing of a following carrier tape among the carrier tapes, which follows into a preceding carrier tape among the carrier tapes, when the following carrier tape is allowed to travel continuously to the preceding carrier tape; and
   a non-splicing feeder that does not require splicing of a following carrier tape among the carrier tapes, which follows into a preceding carrier tape among the carrier tapes, when the following carrier tape is allowed to travel continuously to the carrier tape.

8. The component supply management method of claim 7, wherein the threshold input screen sets both a threshold of the splicing feeder and a threshold of the non-splicing feeder.

9. The component supply management method of claim 6, wherein the remaining amount of components capable of being supplied by the carrier tape and the threshold are defined by a remaining number of the components held in the carrier tape or a remaining length of the carrier tape.

10. The component supply management method of claim 6, further comprising:
    a tape presence detection step of detecting whether the carrier tape is present at a position of the tape insertion port, and
    a component depletion notification step of notifying component depletion when the tape presence detection step detects that the carrier tape is not present at the position of the tape insertion port.

11. A component supply management system managing a component supply state of a tape feeder that allows a carrier tape inserted from a tape insertion port to travel so as to supply a component held in the carrier tape to a component supply position, the system comprising:
    a threshold input screen that sets a threshold with respect to a remaining amount capable of being supplied by the carrier tape, for each of the tape feeders, depending on types of the tape feeders;
    a remaining-amount detection portion that detects a remaining amount of components capable of being supplied by the carrier tape, based on a remaining number of components, for each of the tape feeders, depending on types of the tape feeders;

a control device that determines whether the remaining amount of components capable of being supplied, detected by the remaining-amount detection portion, is lower than the threshold set in the threshold input screen, for each of the tape feeders;

a notification portion that issues a warning for recommending replenishment of the carrier tape for the tape feeder in which the control device determines that the remaining amount of components capable of being supplied is lower than the threshold further comprising a tape presence detector that detects whether the carrier tape is present at a position of the tape insertion port, wherein the notification portion notifies a warning for recommending replenishment of the carrier tape when the tape presence detector detects that the carrier tape is not present at the position of the tape insertion port.

12. A component supply management method for managing a component supply state of a tape feeder that allows a carrier tape inserted from a tape insertion port to travel so as to supply a component held in the carrier tape to a component supply position, the method comprising:

a threshold setting step of setting a threshold with respect to a remaining amount of components capable of being supplied by the carrier tape, for each of the tape feeders, depending on types of the tape feeders on a threshold input screen;

a remaining amount detection step of detecting a remaining amount of components capable of being supplied by the carrier tape, based on a remaining number of components, for each of the tape feeders by a remaining-amount detection portion;

a determination step of determining whether the remaining amount of components capable of being supplied by a control device, based on the detection of the remaining-amount detection step, is lower than the threshold set in the threshold setting step, for each of the tape feeders, depending on types of the tape feeders; and a tape replenishment notification step of issuing a warning for recommending replenishment of the carrier tape with respect to the tape feeder by a notification portion in which it is determined in the determination step that the remaining amount of components capable of being supplied is lower than the threshold further comprising a tape presence detection step of detecting whether the carrier tape is present at a position of the tape insertion port, and a component depletion notification step of notifying component depletion when the tape presence detection step detects that the carrier tape is not present at the position of the tape insertion port.

* * * * *